United States Patent
Ali et al.

(10) Patent No.: US 9,749,031 B2
(45) Date of Patent: Aug. 29, 2017

(54) MUTUAL COUPLING MITIGATION IN A MULTI-PORT ANTENNA SYSTEM

(71) Applicant: BlackBerry Limited, Waterloo (CA)

(72) Inventors: Shirook M. H. Ali, Milton (CA); Michael Eoin Buckley, Grayslake, IL (US); Anmol Bhardwaj, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 0 days.

(21) Appl. No.: 14/681,665

(22) Filed: Apr. 8, 2015

(65) Prior Publication Data
US 2016/0301460 A1    Oct. 13, 2016

(51) Int. Cl.
| | |
|---|---|
| *H01Q 3/40* | (2006.01) |
| *H04B 17/02* | (2006.01) |
| *H04B 7/06* | (2006.01) |
| *H04B 7/04* | (2017.01) |
| *H04B 1/04* | (2006.01) |
| *H04B 17/10* | (2015.01) |
| *H04B 17/11* | (2015.01) |
| *H04B 17/21* | (2015.01) |

(52) U.S. Cl.
CPC ......... *H04B 7/0639* (2013.01); *H04B 1/0458* (2013.01); *H04B 1/0475* (2013.01); *H04B 7/046* (2013.01); *H04B 17/103* (2015.01); *H04B 17/11* (2015.01); *H04B 17/21* (2015.01); *H04B 7/04* (2013.01); *H04B 2001/0425* (2013.01)

(58) Field of Classification Search
CPC .......... H01Q 3/40; H04B 17/12; H04B 17/02; H04B 17/00
See application file for complete search history.

(56) References Cited

U.S. PATENT DOCUMENTS

| | | | |
|---|---|---|---|
| 8,731,483 B2* | 5/2014 | Holter | H01Q 21/061 |
| | | | 455/130 |
| 9,287,620 B2* | 3/2016 | McGowan | H01Q 3/40 |
| 2006/0128436 A1* | 6/2006 | Doi | H01Q 3/2605 |
| | | | 455/562.1 |

(Continued)

FOREIGN PATENT DOCUMENTS

EP    3079282    10/2016

OTHER PUBLICATIONS

Extended European Search Report, EP 16164335.8, dated Aug. 12, 2016.

*Primary Examiner* — Pablo Tran
(74) *Attorney, Agent, or Firm* — Guntin & Gust, PLC; Ralph Trementozzi

(57) ABSTRACT

A system that incorporates teachings of the subject disclosure may include, for example, accessing a group of de-coupling data stored in a memory of a communication device where the group of de-coupling data is mapped to corresponding use cases associated with the communication device, selecting de-coupling data from among the group of de-coupling data according to a determined use case of the communication device, generating a pre-distortion signal according to the selected de-coupling data, combining the pre-distortion signal with RF signals to generate pre-distorted RF signals, and transmitting the pre-distorted RF signals via a multi-port antenna of the communication device. Other embodiments are disclosed.

20 Claims, 12 Drawing Sheets

(56) References Cited

U.S. PATENT DOCUMENTS

| | | | |
|---|---|---|---|
| 2007/0183479 A1* | 8/2007 | Noll | H04B 17/21 |
| | | | 375/132 |
| 2009/0117859 A1* | 5/2009 | Smith | H04B 7/0413 |
| | | | 455/78 |
| 2009/0130992 A1* | 5/2009 | Ganwani | H01Q 1/241 |
| | | | 455/78 |
| 2010/0248651 A1* | 9/2010 | Dent | H01Q 1/246 |
| | | | 455/78 |
| 2012/0289172 A1 | 11/2012 | Holter | |
| 2013/0207843 A1 | 8/2013 | McGowan et al. | |
| 2014/0011460 A1 | 1/2014 | Ali et al. | |
| 2014/0113679 A1 | 4/2014 | Kampermann et al. | |

* cited by examiner

100

|  | Bandwidth | Coupling ($S_{21}$) | Correlation | Power Radiated | MSE |
|---|---|---|---|---|---|
| Percentage Improvement (5mm Spacing) | 5.88% | 17.5% | 48.7% | 53.8% | 47.4% |

LOOK-UP TABLE

| |
|---|
| Band 1; Use Case 1; tuning state; and/or decoupling data |
| Band 1; Use Case 2; tuning state; and/or decoupling data |
| ⋮ |
| Band 1; Use Case n; tuning state; and/or decoupling data |
| Band 2; Use Case 1; tuning state; and/or decoupling data |
| Band 2; Use Case 2; tuning state; and/or decoupling data |
| ⋮ |
| Band 2; Use Case n; tuning state; and/or decoupling data |
| ≈       ≈ |
| Band N; Use Case 1; tuning state; and/or decoupling data |
| Band N; Use Case 2; tuning state; and/or decoupling data |
| ⋮ |
| Band N; Use Case n; tuning state; and/or decoupling data |

MUTUAL COUPLING MITIGATION IN A MULTI-PORT ANTENNA SYSTEM

FIELD OF THE DISCLOSURE

The present invention relates, in general, to a multi-port antenna system, and more particularly, applying a pre-distortion signal to RF signals to mitigate mutual coupling at a multi-port antenna system.

BACKGROUND

Wireless communication devices such as cellular telephones, tablets, and laptops can support multi-cellular access technologies, peer-to-peer access technologies, personal area network access technologies, and location receiver access technologies, which can often operate concurrently. Wireless communication devices can be required to communicate at a variety of frequencies, and in some instances are subjected to a variety of physical and functional use conditions.

Multiple-Input Multiple-Output (MIMO) communication systems are being utilized due in part to their ability to increase channel capacity, and to often provide reliability in communication services. Channel capacity can be approximated using the Shannon-Hartley theorem, which states that channel capacity is a proportional function of signal-to-noise ratio (SNR) and bandwidth. Increasing the bandwidth of a signal in order to increase data rate can introduce multipath fading. MIMO systems can take advantage of multi-path fading by using a combination of antennas allowing the signals to propagate along different paths from transmitting antennas to receiving antennas. However, when multiple antennas are placed very close to each other, mutual coupling can have an adverse impact on the radiated signal.

BRIEF DESCRIPTION OF THE DRAWINGS

Reference will now be made to the accompanying drawings, which are not necessarily drawn to scale, and wherein:

FIGS. 2-5 illustrate results of simulations and testing employing exemplary mutual coupling mitigation processes;

FIG. 14 depicts an illustrative embodiment of a look-up table utilized by the communication device of FIG. 8 for controlling tunable reactive elements utilized by the communication device;

DETAILED DESCRIPTION

Figure 1:
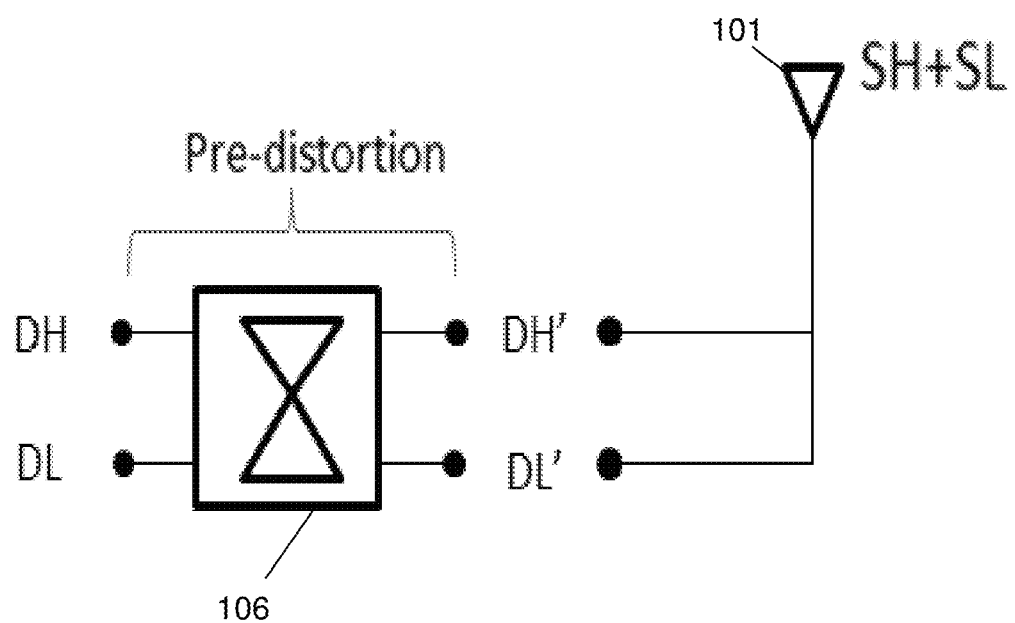
FIG. 1 depicts an illustrative embodiment of a portion of a communication device that can employ mutual coupling mitigation.

The subject disclosure describes, among other things, illustrative embodiments of methods and systems that compensate and control for mutual coupling levels during transmission. RF signals can be pre-processed, such as by adding a pre-distortion signal to the RF signals, so that the mutual coupling between ports of an antenna(s) is reduced or eliminated. The pre-distortion signal can be selected based on a number of factors, such as the particular use case of the wireless device.

In one or more embodiments, the communication device (e.g., via a processor in the RF front end) can combine RF signals (e.g., a pre-distortion signal with input signal(s)) before a multi-port antenna. The combining can be linear and/or the Mean Square Error (MSE) of the signal emitted by the antenna can be less than the MSE of the signal without linear combining. The exemplary embodiments can provide for compensation of mutual coupling in physically one antenna with multiple ports and/or multiple closely spaced antennas/ports. Other embodiments are described by the subject disclosure.

One or more of the exemplary embodiments can compensate for mutual coupling for multiple ports connecting to a single antenna or to different antennas. As an example, the multiple ports can be part of a MIMO system. In another embodiment, the compensation techniques described herein can be utilized in a system that is not MIMO in order to decouple ports. One or more of the exemplary embodiments can be applied to various types of wireless systems, including mobile wireless devices and stationary wireless devices. These devices can be end user devices, such as a mobile phone or laptop, or can be non-end user devices, such as a base station, network element, access point device, and so forth.

One embodiment of the subject disclosure includes a wireless communication device including a multi-port antenna and/or multiple closely spaced antennas, a memory storing computer instructions; and an RF front end including a processor coupled to the memory and the multi-port antenna. The processor, responsive to executing the computer instructions, can perform operations including determining a use case for communications and selecting coupling coefficients according to the use case based on de-coupling data stored in the memory. The processor can generate a pre-distortion signal according to the coupling coefficients and can apply the pre-distortion signal at feeds of the multi-port antenna to RF signals to generate pre-distorted RF signals. The pre-distorted RF signals can be transmitted via the multi-port antenna.

One embodiment of the subject disclosure includes a non-transitory, tangible machine-readable medium encoded with machine-executable instructions, where execution of the machine-executable instructions is for: accessing a group of de-coupling data stored in a memory of a communication device, where the group of de-coupling data is mapped to corresponding use cases associated with the communication device. Execution of the machine-executable instructions causes selecting de-coupling data from among the group of de-coupling data according to a determined use case of the communication device. Execution of the machine-executable instructions causes generating a pre-distortion signal according to the selected de-coupling data. Execution of the machine-executable instructions causes combining the pre-distortion signal with RF signals to generate pre-distorted RF signals. Execution of the machine-executable instructions causes transmitting the pre-distorted RF signals via a multi-port antenna of the communication device.

One embodiment of the subject disclosure includes determining a use case for communications and accessing a group of de-coupling data stored in a memory of the communication device, where the group of de-coupling data is mapped to corresponding use cases associated with the communication device. The method includes selecting de-coupling data from among the group of de-coupling data according to the determined use case and generating a pre-distortion signal according to the selected de-coupling data. The method includes combining the pre-distortion signal with RF signals to generate pre-distorted RF signals and transmitting the pre-distorted RF signals via a multi-port antenna of the communication device.

FIG. 1 depicts an illustrative embodiment of a portion of a communication device 100. The communication device 100 can include one or more antennas 101 (only one of which is shown) and a processor 106. The communication device 100 can include various other components (not shown) that enable providing wireless communication services, such as a power amplifier, a transceiver, a filter, and so forth.

Processor 106 can apply pre-distortion signal(s) to RF signals (e.g., high and low frequency input signals DH and DL) to generate pre-distorted signals DH' and DL'. The pre-distorted signals DH' and DL' can be provided to ports of the antenna 101 for transmitting as transmitted signals SH and SL.

As an example, different high and low frequency signals DH and DL that are to be injected into the antenna ports of antenna 101 are linearly related to the output signals emitted by the antenna due to the leakage caused by the multi-feed architecture. The leakage or coupling matrix L can be defined using the coupling coefficients a and b as follows:

$$L = \begin{bmatrix} 1 & a \\ b & 1 \end{bmatrix} \quad (1)$$

Coupling coefficients 'a' and 'b' can be obtained from experimental measurements, such as performed in a controlled environment including a lab. The linear relationship between the input and output antenna signals can be defined by the following equation:

$$\begin{bmatrix} SH_0 + SL_0 \\ SH_1 + SL_1 \\ \vdots \\ SH_N + SL_N \end{bmatrix} = \begin{bmatrix} DH'_0 & DL'_0 \\ DH'_1 & DL'_1 \\ \vdots & \vdots \\ DH'_N & DL'_N \end{bmatrix} \begin{bmatrix} 1 & a \\ b & 1 \end{bmatrix} \begin{bmatrix} 1 \\ 1 \end{bmatrix} \quad (2)$$

where, DH, DL=high frequency and low frequency input signals; SH, SL=high and Low frequency signals emitted by the antenna.

To reduce or eliminate the effects of mutual coupling between antenna ports of antenna 101, the input signal (DH+DL) can be pre-distorted using processor 106. In one embodiment, the pre-distortion can be such that the output signal (SH+SL) is equal to the input signal. The pre-distortion matrix D in this embodiment can be chosen to be the inverse of the coupling matrix:

$$D = \begin{bmatrix} 1 & a \\ b & 1 \end{bmatrix}^{-1} \quad (3)$$

Therefore the overall system can be represented by the following equation:

$$\begin{bmatrix} SH_0 + SL_0 \\ SH_1 + SL_1 \\ \vdots \\ SH_N + SL_N \end{bmatrix} = \begin{bmatrix} DH'_0 & DL'_0 \\ DH'_1 & DL'_1 \\ \vdots & \vdots \\ DH'_N & DL'_N \end{bmatrix} \begin{bmatrix} 1 & a \\ b & 1 \end{bmatrix} \begin{bmatrix} 1 \\ 1 \end{bmatrix} = \quad (4)$$

$$\begin{bmatrix} DH_0 & DL_0 \\ DH_1 & DL_1 \\ \vdots & \vdots \\ DH_N & DL_N \end{bmatrix} \begin{bmatrix} 1 & a \\ b & 1 \end{bmatrix}^{-1} \begin{bmatrix} 1 & a \\ b & 1 \end{bmatrix} \begin{bmatrix} 1 \\ 1 \end{bmatrix}$$

In one embodiment, the coupling matrix (or other de-coupling data associated with or representative of the coupling matrix) can be pre-measured and stored in a memory of the communication device 100 to reflect different usage scenarios thus enabling the application of pre-distortion compensation dynamically.

Example

Figure 2:
Figure 3:
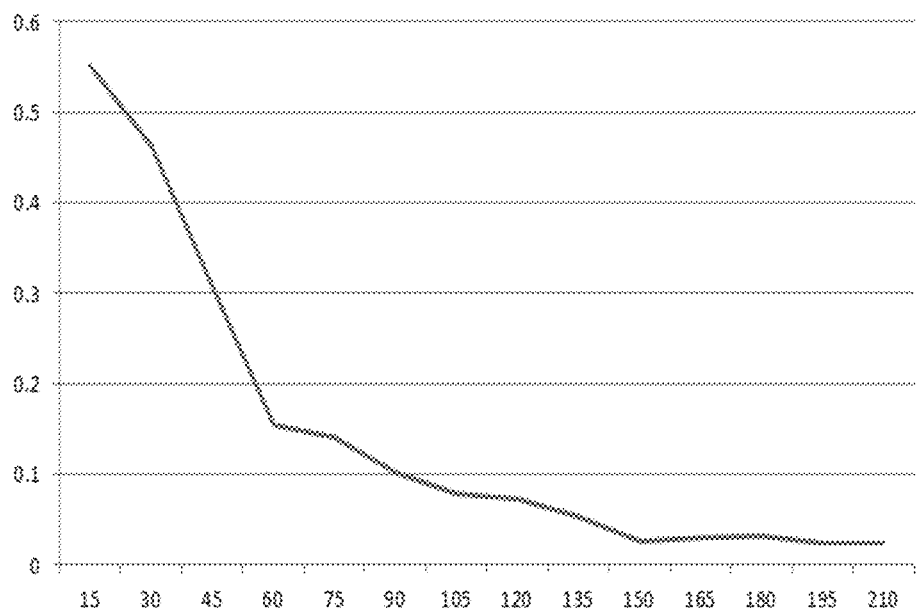

A Matlab script was written in order to implement a mathematical model according to the exemplary embodiments. The script accepts the input signal matrix (DH, DL) and coupling coefficients (a, b) as input parameters. The script uses element-wise matrix operations in order to calculate the MSE. The coupling matrix was measured in the lab. The distance between the antennas was varied and the coupling matrix at every distance value was observed. The measured coupling coefficients were then imported into the Matlab file. The results of this Matlab simulation are illustrated in FIG. 2 which is a graph of MSE (with pre-distortion) vs. antenna spacing (cm) and FIG. 3 which is a graph of MSE (no pre-distortion) vs. antenna spacing (cm). FIGS. 2 and 3 show that the MSE improves significantly when the input signal is pre-distorted. In both cases, MSE decreases as the distance between the antennas increases due to the decreasing mutual coupling between the two antennas.

The model utilized in the exemplary embodiment can also be extended to the N-dimension case, where N is the number of ports whether connecting to the same antenna or to different closely spaced antennas can be considered. For the generalized case, the system can be represented by the following equation:

$$\begin{bmatrix} SH_{1,0} + SL_{1,0} + SH_{2,0} + SL_{2,0} + SH_{N,0} + SL_{N,0} \\ SH_{1,1} - SL_{1,1} + SH_{2,1} + SL_{2,1} + SH_{N,1} + SL_{N,1} \\ \vdots \\ SH_{1,N} + SL_{1,n} + SH_{2,n} + SL_{2,n} + SH_{N,n} + SL_{N,n} \end{bmatrix} =$$

$$\begin{bmatrix} DH'_{1,0} & DL'_{1,0} & DH'_{2,0} & DL'_{2,0} & \cdots & DH'_{N,0} & DL'_{N,0} \\ DH'_{1,1} & DL'_{1,1} & DH'_{2,1} & DL'_{2,1} & \cdots & DH'_{N,1} & DL'_{N,1} \\ \vdots & & & & & & \vdots \\ DH'_{1,N} & DL'_{1,N} & DH'_{2,N} & DL'_{2,H} & \cdots & DH'_{N,N} & DL'_{N,N} \end{bmatrix}$$

$$\begin{bmatrix} 1 & \cdots & a_1 \\ \vdots & \ddots & \vdots \\ b_N & \cdots & 1 \end{bmatrix} \begin{bmatrix} 1 \\ \vdots \\ 1 \end{bmatrix} =$$

$$\begin{bmatrix} DH_{1,0} & DL_{1,0} & DH_{2,0} & DL_{2,0} & \cdots & DH_{N,0} & DL_{N,0} \\ DH_{1,1} & DL_{1,1} & DH_{2,1} & DL_{2,1} & \cdots & DH_{N,1} & DL_{N,1} \\ \vdots & & & & & & \vdots \\ DH_{1,N} & DL_{1,N} & DH_{2,N} & DL_{2,H} & \cdots & DH_{N,N} & DL_{N,N} \end{bmatrix} \begin{bmatrix} 1 & \cdots & a_1 \\ \vdots & \ddots & \vdots \\ b_N & \cdots & 1 \end{bmatrix}^{-1}$$

$$\begin{bmatrix} 1 & \cdots & a_1 \\ \vdots & \ddots & \vdots \\ b_N & \cdots & 1 \end{bmatrix} \begin{bmatrix} 1 \\ \vdots \\ 1 \end{bmatrix}$$

Continuing with the example, the model was then examined with full-wave simulations of two dipole antennas operating at 2 GHz. In order to reduce or minimize mutual coupling between the two dipole antennas, the exemplary pre-distortion technique is applied. Similar to the model described above, the distorted signal was obtained by applying the inverse of the mutual coupling to the excitation signal.

Figure 4:
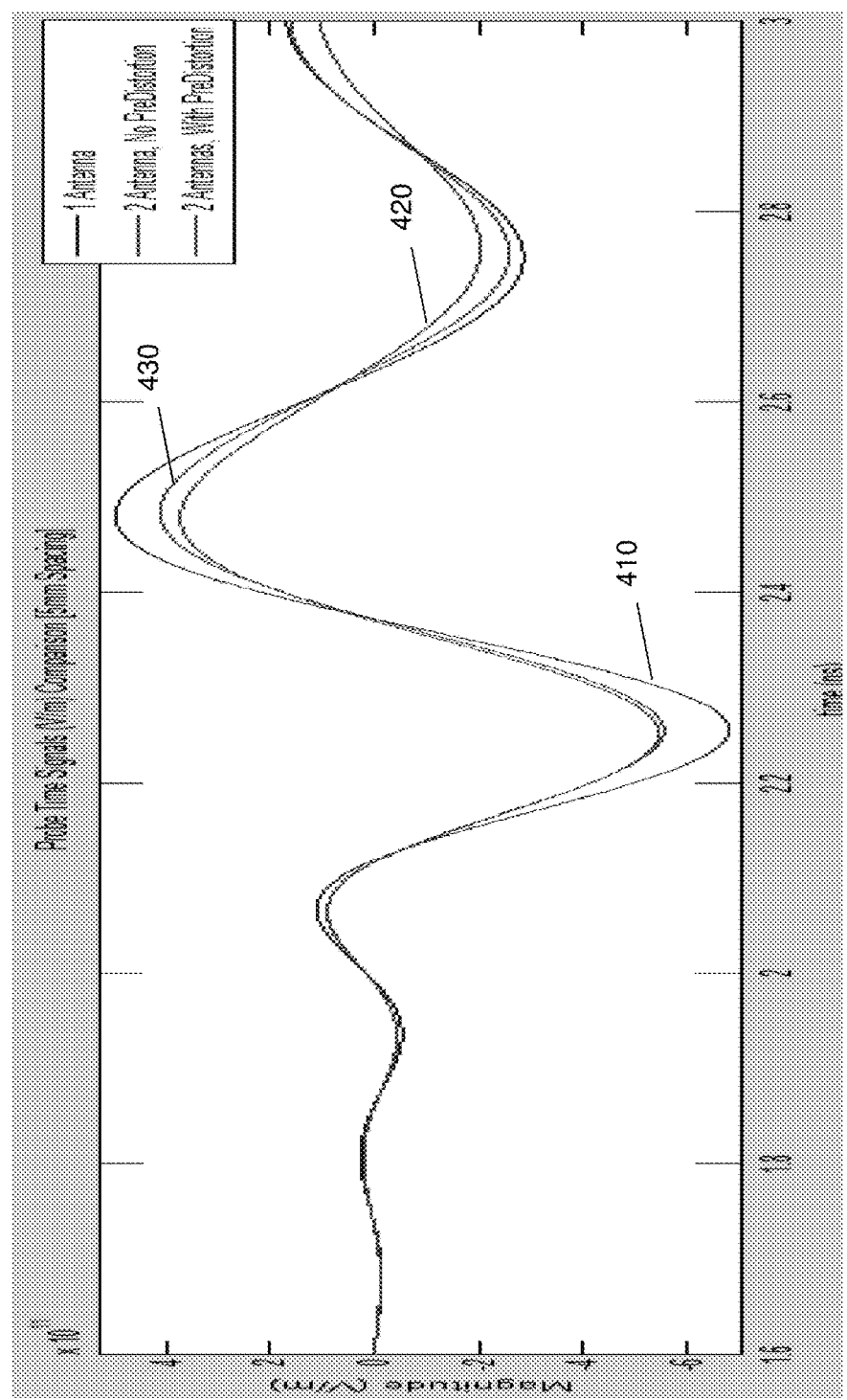

Referring to FIG. 4, a comparison is shown of three different radiated electric fields by the dipole antennas. The first signal 410 represents the radiated electric field by a single dipole antenna where no mutual coupling is involved. This signal is used as a reference signal. The second signal 420 represents the radiated electric field of two dipole antennas, both excited with the original excitation signal. The third signal 430 represents the radiated electric field of two dipole antennas, both excited with the pre-distorted excitation signal. It is evident that the mutual coupling is reduced or minimized since the radiating electric field resulting from the pre-distorted excitation signal is much closer to the reference signal compared to the field resulting from original excitation signal.

Simulations were also performed in order to prove the validity of the model described above for the same two dipoles spaced 5 mm apart. Exciting the antenna ports with the pre-distorted signal showed significant improvements in isolation, bandwidth, and correlation—percentage improvement in performance are shown in Table 500 of FIG. 5 over the non-distorted case. Radiated electric fields resulting from the pre-distorted excitations were significantly closer to the reference signal (radiated field from one antenna) compared to the electric fields resulting from the original excitation. This is proven by calculating the MSE for different antenna spacing. It is noted that the improvement in coupling (i.e., the reduction) did not come at the expense of the other performance metrics, but in many cases it had a positive impact on these as well.

In one or more embodiment, the pre-distortion of the exemplary embodiments can be implemented in real-time on a wireless communication device, such as a mobile phone, for dynamic de-coupling of the antennas ports. As an example, a decoupling algorithm can be employed that tracks changes by the user, such as a change in how the device is being held.

In one or more embodiments, the processor 106 can be located in the RF front end and/or can be a distinct component from the baseband processor. The RF front end can include all of the components between the antenna(s) and the digital baseband system. For example for a receiver, the RF front end can include all of the filters, low-noise amplifiers (LNAs), and down-conversion mixer(s) that are utilized to process the modulated signals received at the antenna into signals suitable for input into the baseband analog-to-digital converter (ADC). The RF front end can be considered as the analog-to-digital or RF-to-baseband portion of the receiver.

Figure 6:
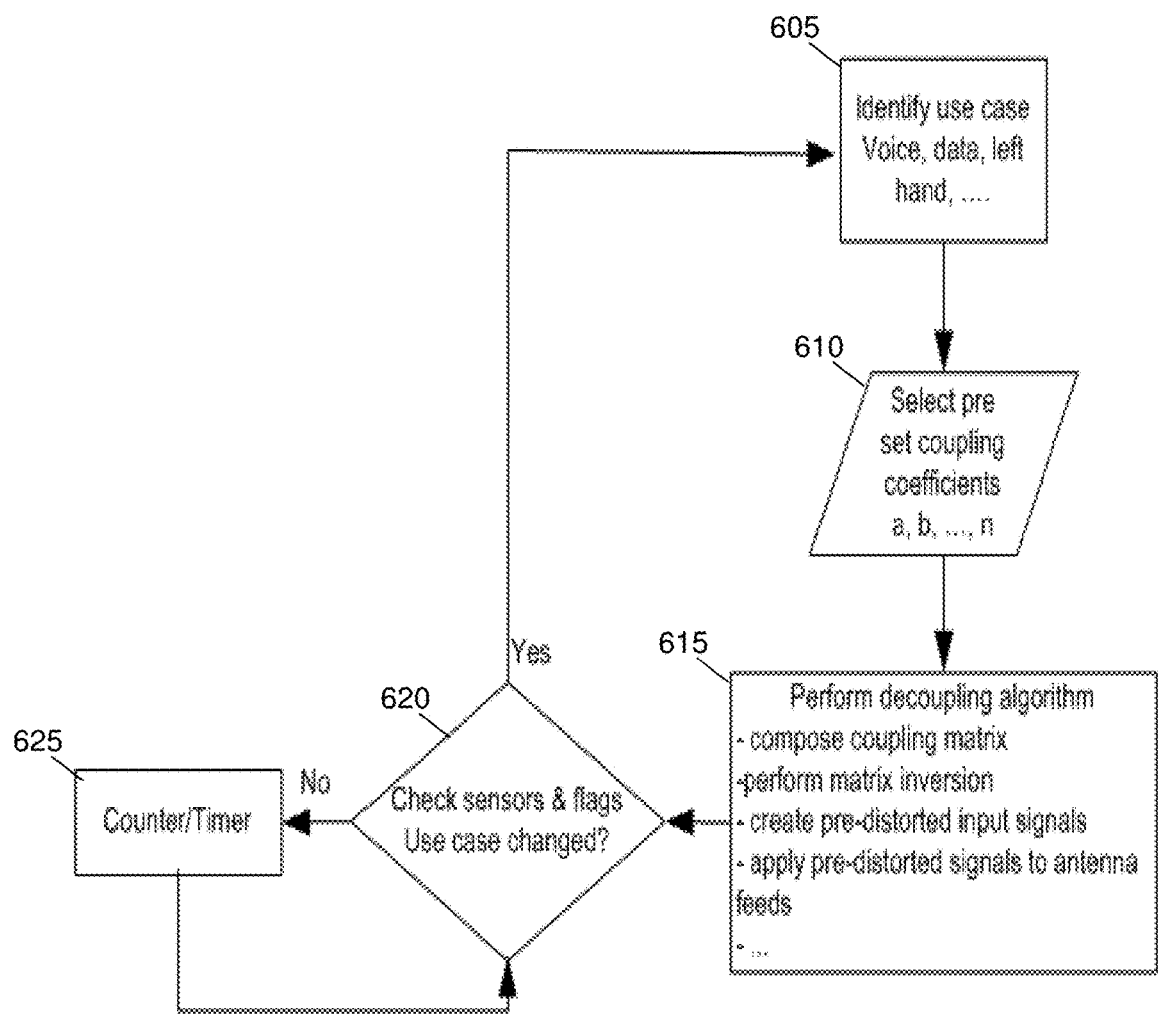
FIGS. 6-7 depict exemplary methods that can be used for mitigating mutual coupling in a multi-port antenna.

In FIG. 6, a method 600 is illustrated for dynamic decoupling utilizing a pre-distortion signal. At 605, a use case for the communication device can be identified. The use case can be a physical use case of the device, such as how the device is physically configured (e.g., slider out, head set connected, and so forth) or how the device is being handled by the user with respect to a position of the device and a position of the user or body part of the user (e.g., left hand up to right side of head, and so forth). In one embodiment, the use case can also include an operational state of the device, such as speaker phone on, Bluetooth engaged, voice session active, data session active, and so forth.

The identification or determination of the use case can be performed in various ways, such as based on measured parameters. In one embodiment, parameters can be measured or otherwise obtained that are predictive of the use cases. For instance, power measurements (e.g., VSWR) can be obtained and utilized to determine a particular use case, such as a particular reflected power indicating that the device is being held in the user's hand against the user's head. In one embodiment, the collection of the parameters can already be performed by the device for other purposes, such as for impedance matching utilizing a matching network.

Once the use case is identified then at 610 coupling coefficients associated with the use case can be selected or determined. For example, coupling coefficients can be stored in a table or other data structure in a memory of the communication device and can be mapped to particular use cases. The communication device can then select the coupling coefficients that correspond to the identified use case. It should be understood that the identified use case can also be a plurality of use cases (or other factors) that are utilized in selecting the stored coupling coefficients. The stored coupling coefficients can be derived as described above and then provisioned to the communication device, such as at the time of manufacture of the communication device or via OTA provisioning.

At 615, a pre-distortion signal can be generated according to the coupling coefficients and applied to the RF signals to compensate for the mutual coupling. In one embodiment, the coupling coefficients can be used to compute a pre-distortion matrix which is then applied to the RF signals before entering the multiport antenna. For instance, the pre-distortion matrix can be generated by performing an inversion of a coupling matrix generated from the coupling coefficients. At 620 and 625, the communication device can monitor for a change in use case which would trigger changing the pre-distortion signals (i.e., selecting new coupling coefficients corresponding to the new use case). The method 600 can utilize counters or timers for implementing various steps of the method.

In one embodiment, the coupling coefficients can be measured and presorted during development of the device and pre-programmed during the manufacturing stage of the device. The data used as part of the pre-distortion process can also be part of other functions of the communication device such as an antenna impedance tuning algorithm, for example, that is implemented by the communication device. For instance, measured data used for adjusting a variable reactance in a matching network can also be used for determining the use case or otherwise determining the pre-distortion signal to be utilized to reduce or eliminate mutual coupling. In one embodiment, a coupling matrix or its inverted form, can be selected according to sensor flags and/or according to measured reflected power at an antenna port.

Figure 7:
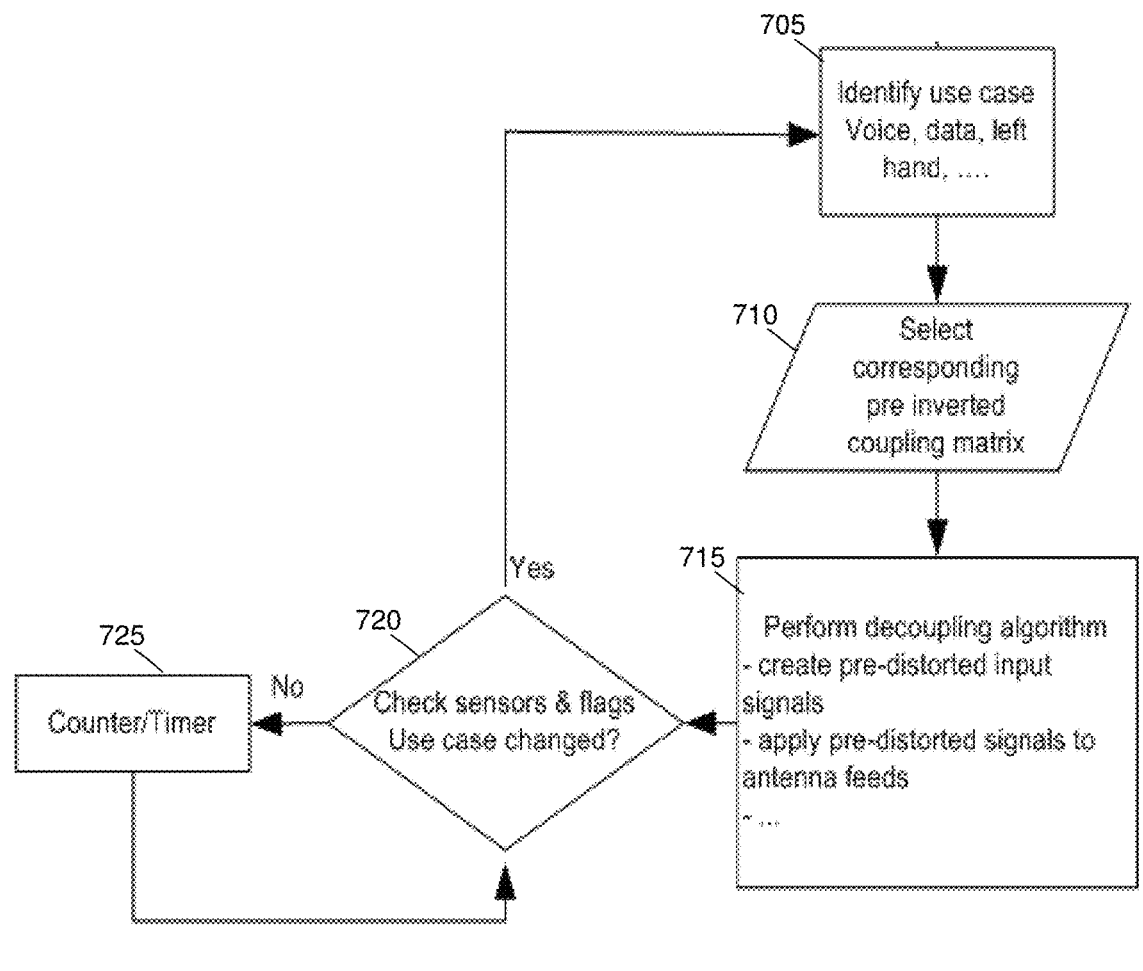

In another embodiment, matrix inversions can be pre-computed and stored ahead of time as shown in method 700 of FIG. 7. In this approach the pre-distortion matrix can be identified directly from the use case(s), which can reduce the computational overhead on the communication device and the required time for the method to be performed. The pre-distortion matrix can therefore be applied directly to the RF signals before entering the multiport antenna. For example, at 705, the use case for the communication device can be identified and at 710 the pre-distortion matrix can be selected from a group of stored pre-distortion matrixes according to the use case. At 715, the RF signals can be pre-distorted using a pre-distortion signal generated from the selected pre-distortion matrix. At 720 and 725, the communication device can monitor for a change in use case which would trigger changing the pre-distortion signals (i.e., selecting a new pre-distortion matrix corresponding to the new use case). The method 700 can utilize counters or timers for implementing various steps of the method.

The pre-distortion process of methods 600 and/or 700 to mitigate mutual coupling can be selectively applied. For example, pre-distortion signals can be generated and injected into all of the ports of the antenna(s) or less than all of the ports of the antenna(s). As another example, the pre-distortion signals can be applied to all of the antennas or less than all of the antennas in a multi-antenna system. The selection of ports and/or antennas which will be subject to the mutual coupling mitigation process can be based on various factors including the particular operational band, coupling levels between ports, type of communication (e.g., voice vs. data), signal strength parameters, and so forth.

Radio band information is generally available or otherwise retrievable in communication devices, which provides the broadest definition of where in a frequency spectrum a communication device such as a handset is operating (e.g., transmitting). In communication systems (e.g., cellular systems), frequencies are commonly allocated for usage in a block or range of frequencies. This block or range of frequencies is commonly known as a radio band. Multiple radio bands can be present in any given cellular system, and in any geographic location there can be multiple cellular systems present.

A radio channel identifies a discrete set of frequencies in a cellular system that contains the downlink (from base station to the handset) and uplink (from handset to base station) radio signals. Downlink is also referred to as Rx and uplink is also referred to as Tx. In most systems, such as WCDMA (Wideband Code Division Multiple Access), uplink and downlink use separate frequencies that are separated by the duplex distance, which is the number of Hz separating the uplink and downlink paths. For other systems, such as TD-LTE (Time Division Long Term Evolution), the uplink and downlink can use the same frequency.

One or more of the exemplary embodiments can utilize radio band information, including only radio band information in some embodiments, for antenna tuning. The exemplary embodiments can apply to various types of communication devices, including wireless handsets operating utilizing one or more of various communication protocols. The antenna tuning can be performed in conjunction with mutual coupling compensation via pre-distortion signals.

RF tuning based on limited information, such as only the radio band, can create a number of problems. In an ideal cellular system that employs RF tuning, the tuner would be set to match every frequency on which the radio receives or transmits, with the understanding that typically a single antenna is used for both Rx and Tx which requires the RF tuner to change tuning state as the RF signal on the antenna changes frequency. For half-duplex systems, such as GSM that would be for every Rx and Tx, including neighbor cells. In full-duplex systems, such as WCDMA where both Rx and Tx are present concurrently, the RF tuner has to change when the frequency changes for handoffs and neighbor cell monitoring, and additionally the tuning state has to be a duplex setting for Rx and Tx on a frequency between the Rx and Tx frequencies.

In order to perform RF tuning in such an ideal system, the entity controlling the tuner could require exact knowledge in real time of all relevant information pertaining to operating the tuner, such as the radio timing, radio band, radio channel, RF duplex information, and transmit state. Tuning based on limited information occurs when the entity controlling the tuner does not have all the information required to set the RF tuner to match an exact frequency at a given time. For example, real time channel information could be missing, in which case the tuner control entity could set the RF tuner based on information pertaining to the Radio Band only.

Transmit (Tx) and Receive (Rx) operations may not be tuned in real-time. This can result in or necessitate a broader duplex type tuning. Duplex tuning refers to where the tunable element for a particular sub-band or radio channel is tuned to a frequency between uplink and downlink; one tuning state can be used for both Rx and Tx in this case. In some systems that are full-duplex (concurrent uplink and downlink, such as WCDMA), duplex tuning is commonly used. Other systems that are half-duplex (uplink and downlink are not concurrent, such as GSM), the tuner can be tuned for both Rx and Tx.

Sub-band describes a grouping of frequencies (e.g., radio channels) consisting of one or more radio channels. In tuning applications, sub-dividing a radio band into multiple sub-bands can provide the advantage of being able to apply a particular tuning state to a small or smaller range of radio channels. Sub-bands can be used in conjunction with storage and application of calibration data in cellular handsets, providing a compromise between accuracy and amount of storage needed to hold said calibration data.

An example of a radio band is the GSM 900 band, in which the uplink frequencies can occupy the range 880.0 to 915.0 MHz and the downlink frequencies can occupy the range 925.0 to 960.0 MHz. The duplex spacing can be 45 MHz. The first channel can be channel 975 which has uplink at 880.2 MHz and downlink at 915.2 MHz. The last channel can be channel 124 which has uplink at 914.8 MHz and downlink at 959.8 MHz.

The GSM 900 band can, for example, be subdivided into 3 sub bands as follows: Sub band 1 ranging from channel 975 to channel 1023 (48 channels, 9.6 MHz wide), Sub Band 2 ranging from channel 0 to channel 66 (66 channels, 13.2 MHz wide), and sub band 3 ranging from channel 67 to channel 124 (57 channels, 11.4 MHz wide). This is an example of a radio band and sub-bands, and the present disclosure can include various configurations of radio bands and sub-bands.

Similar principles can be applied to other existing wireless access technologies (e.g., UMTS, etc.) as well as future generation access technologies.

Figure 8:
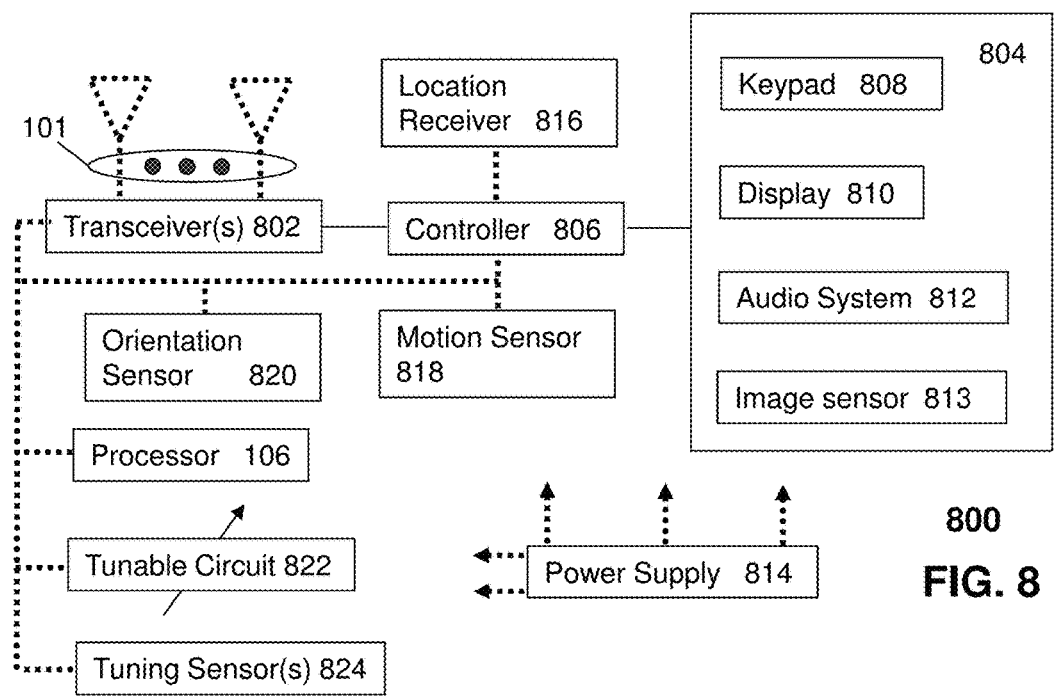
FIG. 8 depicts an illustrative embodiment of a communication device that can employ mutual coupling mitigation.

FIG. 8 depicts an illustrative embodiment of a communication device 800 that can provide pre-distortion compensation to reduce or eliminate mutual coupling. Communication device 800 can include processor 106 which can access a group of de-coupling data stored in a memory of the communication device, where the group of de-coupling data is mapped to corresponding use cases associated with the communication device. The processor 106 can select particular de-coupling data from among the group of de-coupling data according to a determined use case of the communication device and can then generate a pre-distortion signal according to the selected particular de-coupling data. The pre-distortion signal can then be applied to or combined with the RF signals to generate pre-distorted RF signals which are transmitted via the multi-port antenna 101 of the communication device 800.

In one embodiment, antenna 101 is part of a multiple-input and multiple-output antenna system, and communication device 800 is a mobile device such as a phone. In one embodiment, a first mean square error of the pre-distorted RF signals is less than a second mean square error of the RF signals. In one embodiment, the selecting of the particular de-coupling data includes selecting a de-coupling matrix from among a group of de-coupling matrices that are stored in the memory. In one embodiment, the generating of the pre-distortion signal is according to coupling coefficients. In one embodiment, the generating of the pre-distortion signal includes generating a coupling matrix using coupling coefficients; inverting the coupling matrix to determine a de-coupling matrix; and generating the pre-distortion signal based on the de-coupling matrix. In one embodiment, wherein the antenna 101 is a two-port antenna and/or the use case includes a physical use state of the communication device 800.

In one embodiment, the applying of the pre-distortion signal is at feeds of the multi-port antenna 101 and includes applying the pre-distortion signal at the feeds of a subset of ports of the multi-port antenna, where at least one port of the multi-port antenna does not receive the pre-distortion signal. In one embodiment, the determining of the use case includes measuring a power parameter associated with the communications. In one embodiment, the power parameter includes a reflected power associated with the multi-port antenna. In one embodiment, the memory of the communication device 800 can be provisioned with the de-coupling data, where the de-coupling data is pre-determined by a computing device based on different antenna spacing. In one embodiment, the applying of the pre-distortion signal to the RF signals is a linear combination.

The communication device 800 can comprise one or more transceivers 802 coupled to one or more antennas 101, each transceiver having transmitter and receiver sections (herein transceiver 802 or transceivers 802), a tunable circuit 822, one or more tuning sensors 824, a user interface (UI) 804, a power supply 814, a location receiver 816, a motion sensor 818, an orientation sensor 820, and a controller 806 for managing operations thereof. The transceiver 802 can support short-range or long-range wireless access technologies such as Bluetooth, ZigBee, Wireless Fidelity (WiFi), Digital Enhance Cordless Telecommunications (DECT), or cellular communication technologies, just to mention a few.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 802 can also be adapted to support circuit-switched wireline access technologies such as Public Switched Telephone Network (PSTN), packet-switched wireline access technologies such as TCP/IP, Voice over IP-VoIP, etc., or combinations thereof.

The tunable circuit 822 can comprise variable reactive elements such as variable capacitors, variable inductors, or combinations thereof that are tunable with digital and/or analog bias signals. The tunable circuit 822 can represent a tunable matching network coupled to the antenna 101 to compensate for a change in impedance of the antenna 101, a compensation circuit to compensate for mutual coupling in a multi-antenna system, an amplifier tuning circuit to control operations of an amplifier of the transceiver 802, a filter tuning circuit to alter a pass band of a filter used by the transceiver 802, and so on.

Figure 9:
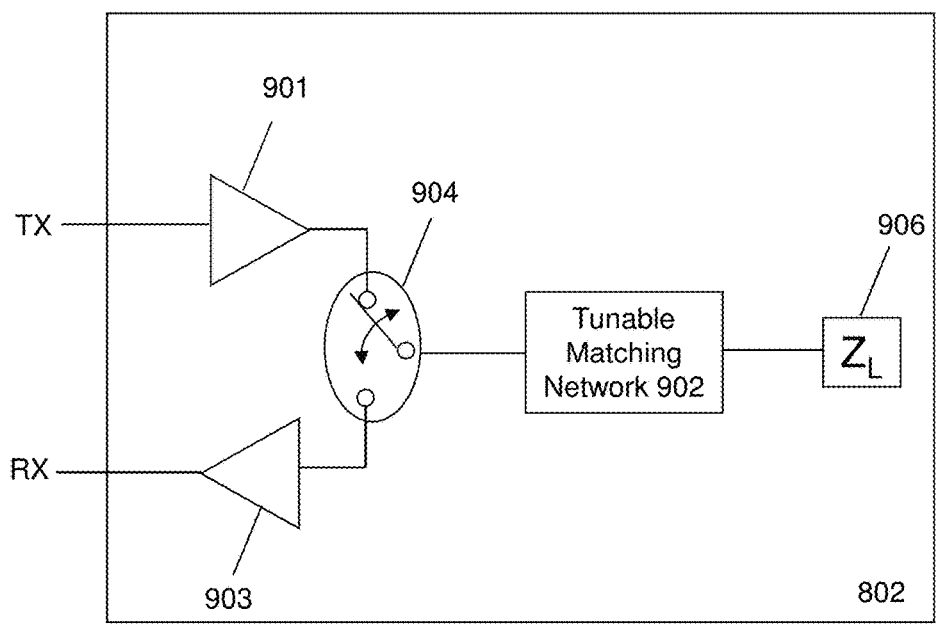
FIG. 9 depicts an illustrative embodiment of a portion of a transceiver of the communication device of FIG. 8.

The tuning sensors 824 can be placed at any stage of the transceiver 802 such as, for example, before or after a matching network 202, and/or at a power amplifier 901 as shown in FIG. 9. The tuning sensors 824 can utilize any suitable sensing technology such as directional couplers, voltage dividers, or other sensing technologies to measure signals at any stage of the transceiver 802. The digital samples of the measured signals can be provided to the controller 806 by way of analog-to-digital converters included in the tuning sensors 824. Data provided to the controller 806 by the tuning sensors 824 can be used to measure, for example, transmit power, transmitter efficiency, receiver sensitivity, power consumption of the communication device 800, frequency band selectivity by adjusting filter passbands, linearity and efficiency of power amplifiers, specific absorption rate (SAR) requirements, and so on. The controller 806 (and/or the processor 106) can be configured to execute one or more tuning algorithms to determine desired tuning states of the tunable circuit 822 based on the foregoing measurements. The controller 806 can be a separate component from processor 106 or can be integrated therewith. The controller 806 and or the processor 106 can be located in the RF front end or can be located outside of the RF front end. The tuning process can be utilized in conjunction with the mutual coupling mitigation techniques that utilized the pre-distortion signal. For example, the use case of the communication device 800 can be determined (e.g., based on a measured operational parameter such as reflected power) and then the use case can be utilized for selecting the decoupling data as well as selecting tuning settings for adjusting a variable reactance element of the tuning circuit 822.

The UI 804 can include a depressible or touch-sensitive keypad 808 with a navigation mechanism such as a roller ball, a joystick, a mouse, or a navigation disk for manipulating operations of the communication device 800. The keypad 808 can be an integral part of a housing assembly of the communication device 800 or an independent device operably coupled thereto by a tethered wireline interface (such as a USB cable) or a wireless interface supporting, for example, Bluetooth. The keypad 808 can represent a numeric keypad commonly used by phones, and/or a QWERTY keypad with alphanumeric keys. The UI 804 can further include a display 810 such as monochrome or color LCD (Liquid Crystal Display), OLED (Organic Light Emitting Diode) or other suitable display technology for conveying images to an end user of the communication device 800. In an embodiment where the display 810 is touch-sensitive, a portion or all of the keypad 808 can be presented by way of the display 810 with navigation features.

The display 810 can use touch screen technology to also serve as a user interface for detecting user input. As a touch screen display, the communication device 800 can be adapted to present a user interface with graphical user interface (GUI) elements that can be selected by a user with a touch of a finger. The touch screen display 810 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 810 can be an integral part of the housing assembly of the communication device 800 or an independent device communicatively coupled thereto by a tethered wireline interface (such as a cable) or a wireless interface.

The UI 804 can also include an audio system 812 that utilizes audio technology for conveying low volume audio (such as audio heard in proximity of a human ear) and high volume audio (such as speakerphone for hands free operation). The audio system 812 can further include a microphone for receiving audible signals of an end user. The audio system 812 can also be used for voice recognition applications. The UI 804 can further include an image sensor 813 such as a charged coupled device (CCD) camera for capturing still or moving images.

The power supply 814 can utilize common power management technologies such as replaceable and rechargeable batteries, supply regulation technologies, and/or charging system technologies for supplying energy to the components of the communication device 800 to facilitate long-range or short-range portable applications. Alternatively, or in combination, the charging system can utilize external power sources such as DC power supplied over a physical interface such as a USB port or other suitable tethering technologies.

The location receiver 816 can utilize location technology such as a global positioning system (GPS) receiver capable of assisted GPS for identifying a location of the communication device 800 based on signals generated by a constellation of GPS satellites, which can be used for facilitating location services such as navigation. The motion sensor 818 can utilize motion sensing technology such as an accelerometer, a gyroscope, or other suitable motion sensing technology to detect motion of the communication device 800 in three-dimensional space. The orientation sensor 820 can utilize orientation sensing technology such as a magnetometer to detect the orientation of the communication device 800 (north, south, west, and east, as well as combined orientations in degrees, minutes, or other suitable orientation metrics).

The communication device 800 can use the transceiver 802 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 806 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 800.

Other components not shown in FIG. 8 can be used by the subject disclosure. The communication device 800 can include a slot for inserting or removing an identity module such as a Subscriber Identity Module (SIM) card. SIM cards can be used for identifying and registering for subscriber services, executing computer programs, storing subscriber data, and so forth.

Other components not shown in FIG. 8 can be added to the communication device 800. For example, the communication device 800 can include a slot for inserting or removing an identity module such as a Subscriber Identity Module (SIM) card. SIM cards can be used for identifying and registering subscriber services, executing computer programs, storing subscriber data, and so forth.

FIG. 9 depicts an illustrative embodiment of a portion of the wireless transceiver 802 of the communication device 800 of FIG. 8. In GSM applications, the transmit and receive portions of the transceiver 802 can include amplifiers 901, 903 coupled to a tunable matching network 902 that is in turn coupled to an impedance load 906. The impedance load 906 in the present illustration can be the antenna 101 as shown in FIG. 1 (herein antenna 906). A transmit signal in the form of a radio frequency (RF) signal (TX) can be directed to the amplifier 901 which amplifies the signal and directs the amplified signal to the antenna 906 by way of the tunable matching network 902 when switch 904 is enabled for a transmission session. The receive portion of the transceiver 802 can utilize a pre-amplifier 903 which amplifies signals received from the antenna 906 by way of the tunable matching network 902 when switch 904 is enabled for a receive session. Other configurations of FIG. 9 are possible for other types of cellular access technologies such as CDMA, UMTS, LTE, and so forth. These undisclosed configurations are applicable to the subject disclosure. Tunable matching network 902 can be integrated with or a separate component from tunable circuit 822 of FIG. 8.

Figure 10:
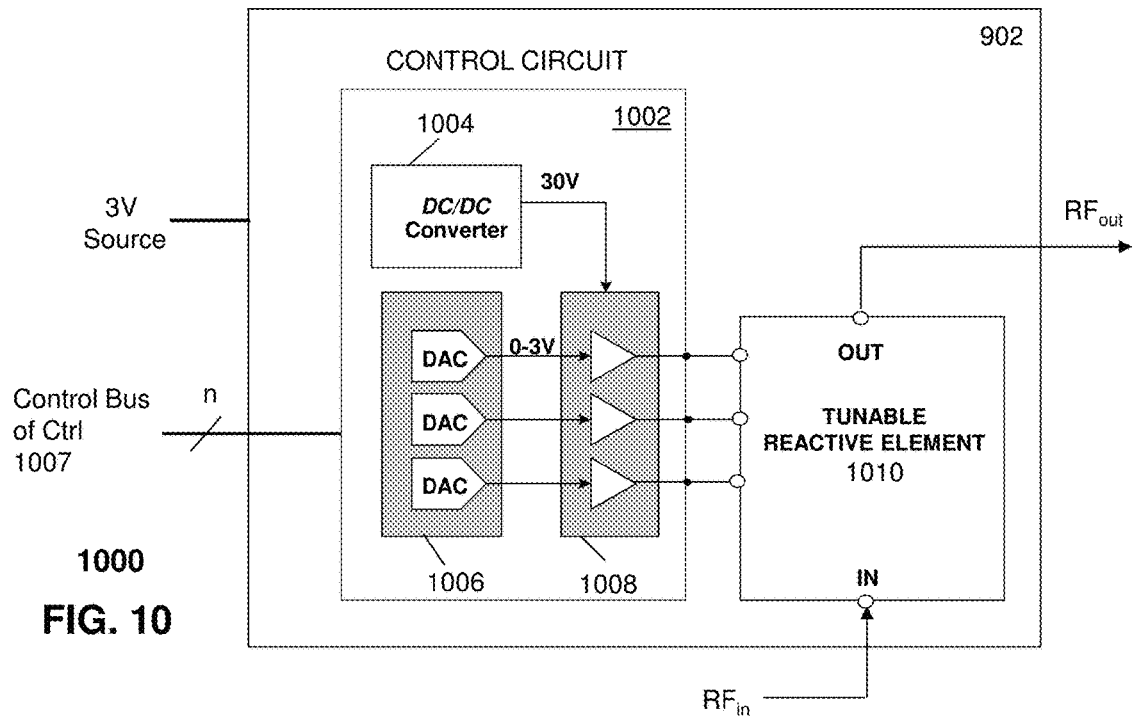
FIGS. 10-13 depict illustrative embodiments of a tunable matching network of the transceiver of FIG. 9.
Figure 11:
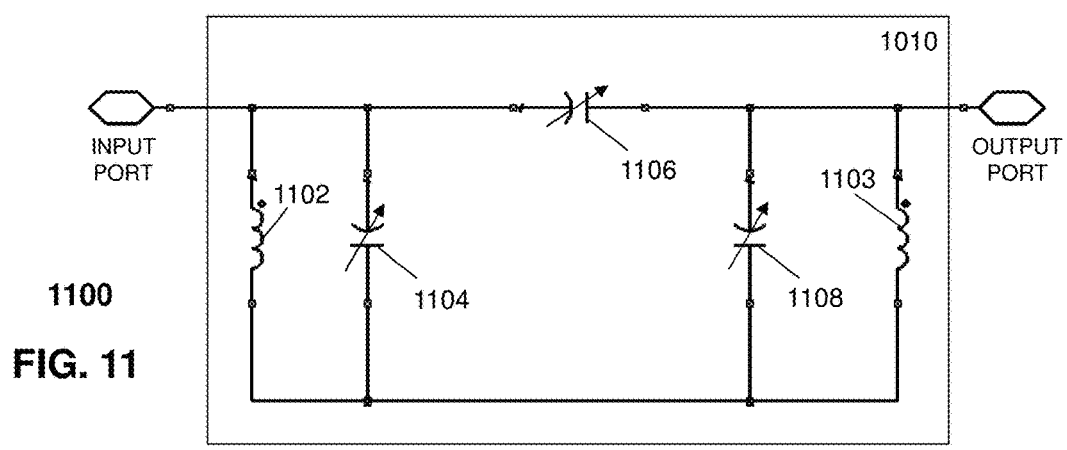

FIGS. 10-11 depict illustrative embodiments of the tunable matching network 902 of the transceiver 802 of FIG. 9. In one embodiment, the tunable matching network 902 can comprise a control circuit 1002 and a tunable reactive element 1010. The control circuit 1002 can comprise a DC-to-DC converter 1004, one or more digital to analog converters (DACs) 1006 and one or more corresponding buffers 1008 to amplify the voltage generated by each DAC. The amplified signal can be fed to one or more tunable reactive components 1104, 1106 and 1108 such as shown in FIG. 11, which depicts a possible circuit configuration for the tunable reactive element 1010. In this illustration, the tunable reactive element 1010 includes three tunable capacitors 1104-1108 and two inductors 1102-1103 with a fixed inductance. Circuit configurations such as "Tee", "Pi", and "L" configurations for a matching circuit are also suitable configurations that can be used in the subject disclosure. In one or more embodiments, switches can be utilized for changing the circuit configurations, such as enabling switching between "Tee", "Pi", and "L" configurations.

The tunable capacitors 1104-1108 can each utilize technology that enables tunability of the reactance of the component. One embodiment of the tunable capacitors 1104-1108 can utilize voltage or current tunable dielectric materials. The tunable dielectric materials can utilize, among other things, a composition of barium strontium titanate (BST). In another embodiment, the tunable reactive element 1010 can utilize semiconductor varactors, or microelectromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 1010 of FIG. 10.

The DC-to-DC converter 1004 can receive a DC signal such as 3 volts from the power supply 814 of the communication device 800 in FIG. 8. The DC-to-DC converter 1004 can use technology to amplify a DC signal to a higher range (e.g., 30 volts) such as shown. The controller 806 can supply digital signals to each of the DACs 1006 by way of a control bus 1007 of "n" or more wires or traces to individually control the capacitance of tunable capacitors 1104-1108, thereby varying the collective reactive impedance of the tunable matching network 902. The control bus 1007 can be implemented with a two-wire serial bus technology such as a Serial Peripheral Interface (SPI) bus (referred to herein as SPI bus 1007). With an SPI bus 1007, the controller 806 can transmit serialized digital signals to configure each DAC in FIG. 10. The control circuit 1002 of FIG. 10 can utilize digital state machine logic to implement the SPI bus 1007, which can direct digital signals supplied by the controller 806 to the DACs to control the analog output of each DAC, which is then amplified by buffers 1008. In one embodiment, the control circuit 1002 can be a stand-alone component coupled to the tunable reactive element 1010. In another embodiment, the control circuit 1002 can be integrated in whole or in part with another device such as the controller 806.

Although the tunable reactive element 1010 is shown in a unidirectional fashion with an RF input and RF output, the RF signal direction is illustrative and can be interchanged. Additionally, either port of the tunable reactive element 1010 can be connected to a feed point of the antenna 906, a structural element of the antenna 906 in an on-antenna configuration, or between antennas for compensating mutual coupling when diversity antennas are used, or when antennas of differing wireless access technologies are physically in close proximity to each other and thereby are susceptible to mutual coupling. The pre-distortion techniques described with respect to methods 600 and/or 700 can be employed at all or some the ports of the antenna 906. The tunable reactive element 1010 can also be connected to other circuit components of a transmitter or a receiver section such as filters, amplifiers, and so on, to control operations thereof.

Figure 13:
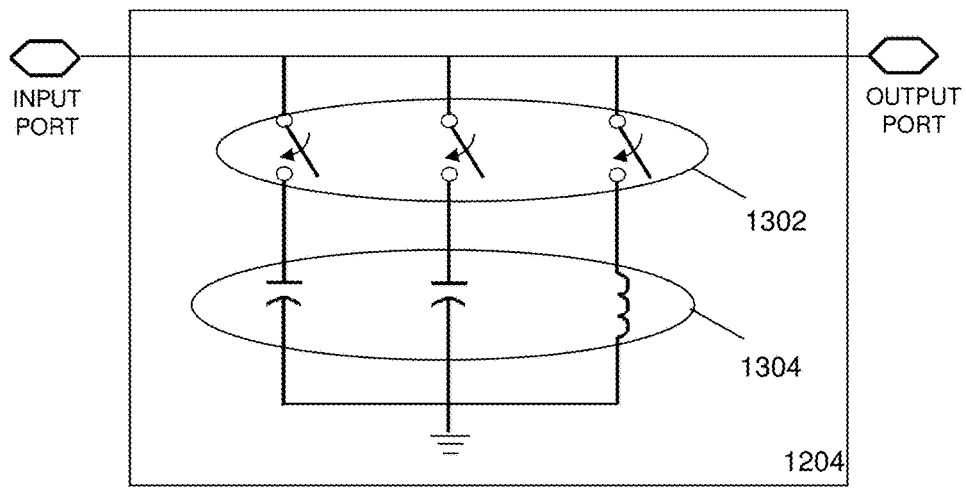

In another embodiment, the tunable matching network 902 of FIG. 9 can comprise a control circuit 1202 in the form of a decoder and a tunable reactive element 1204 comprising switchable reactive elements such as shown in FIG. 13. In this embodiment, the controller 806 can supply the control circuit 1202 signals via the SPI bus 1007, which can be decoded with Boolean or state machine logic to individually enable or disable the switching elements 1302. The switching elements 1302 can be implemented with semiconductor switches, MEMS, or other suitable switching technology. By independently enabling and disabling the reactive elements 1307 (capacitor or inductor) of FIG. 13 with the switching elements 1302, the collective reactive impedance of the tunable reactive element 1204 can be varied by the controller 806.

Figure 12:
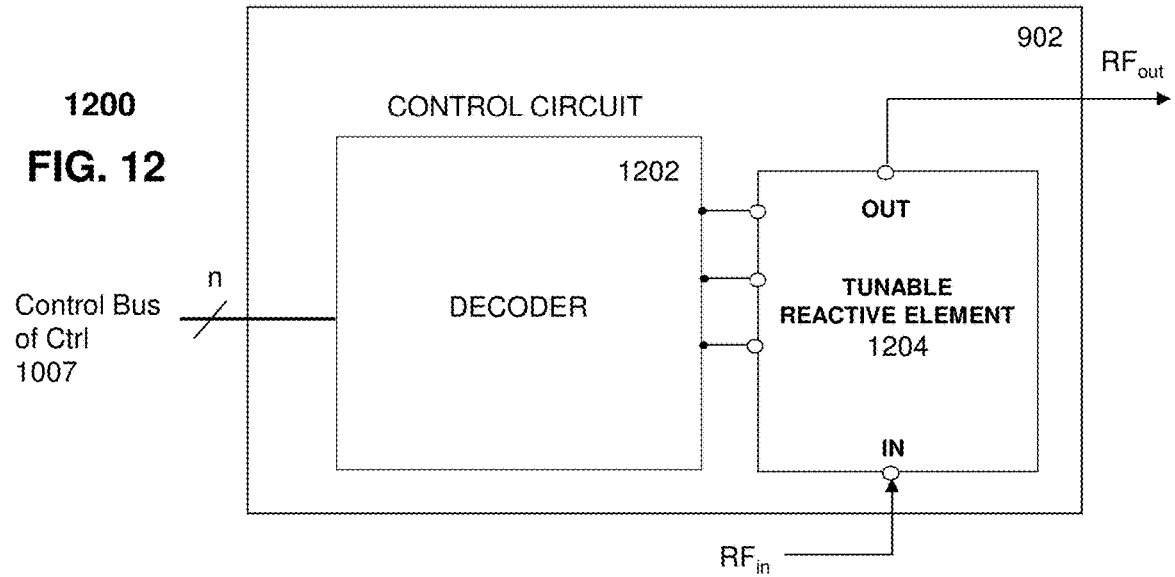

The tunable reactive elements 1010 and 1204 of FIGS. 10 and 12, respectively, can be used with various circuit components of the transceiver 802 to enable the controller 806 to manage performance factors such as, for example, but not limited to, transmit power, transmitter efficiency, receiver sensitivity, power consumption of the communication device 800, frequency band selectivity by adjusting filter passbands, linearity and efficiency of power amplifiers, SAR requirements, among other operational parameters.

Figure 15:
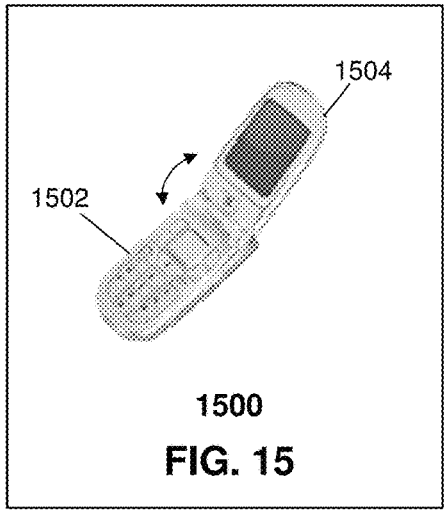
FIGS. 15-18 depict illustrative physical and operational use cases of a communication device.

FIG. 14 depicts an illustration of a look-up table stored in memory, which can be accessed by the processor 106 and/or controller 806 according to physical and/or functional use cases of the communication device. A physical use case can represent a physical state of the communication device, while a functional use case can represent an operational state of the communication device. For example, for a flip phone 1500 of FIG. 15, an open flip can represent one physical use case, while a closed flip can represent another physical use case. In a closed flip state (i.e., bottom and top flips 1502-1504 are aligned), a user is likely to have his/her hands surrounding the top flip 1502 and the bottom flip 1504 while holding the phone 1500, which can result in one range of load impedances experienced by an internal or retrievable antenna (not shown) of the phone 1500. The range of load impedances of the internal or retrievable antenna can be determined by empirical analysis.

With the flip open a user is likely to hold the bottom flip 1502 with one hand while positioning the top flip 1504 near the user's ear when an audio system of the phone 1500, such audio system 812 of FIG. 8, is set to low volume, and voice channel is active. If, on the other hand, the audio system 812 is in speakerphone mode, it is likely that the user is positioning the top flip 1504 away from the user's ear. In these arrangements, different ranges of load impedances can be experienced by the internal or retrievable antenna, which can be analyzed empirically. The low and high volume states of the audio system 812, as well as, a determination that a voice channel is active, illustrates varying functional use cases.

Figure 16:
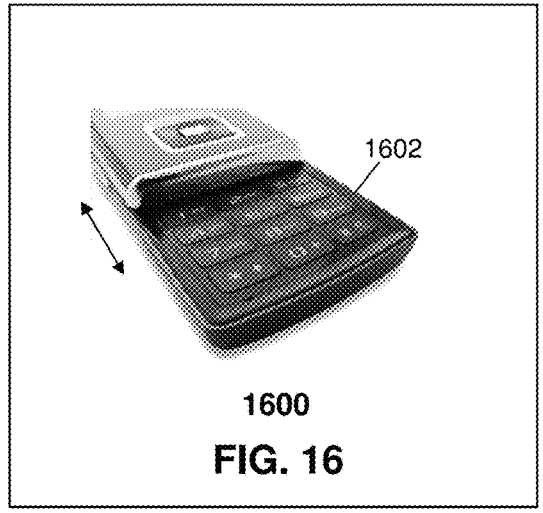
Figure 17:
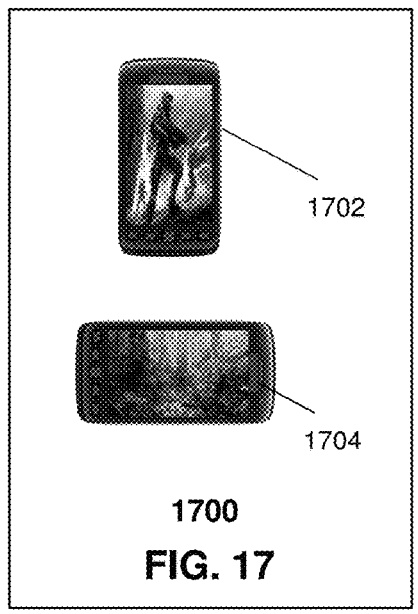
Figure 18:
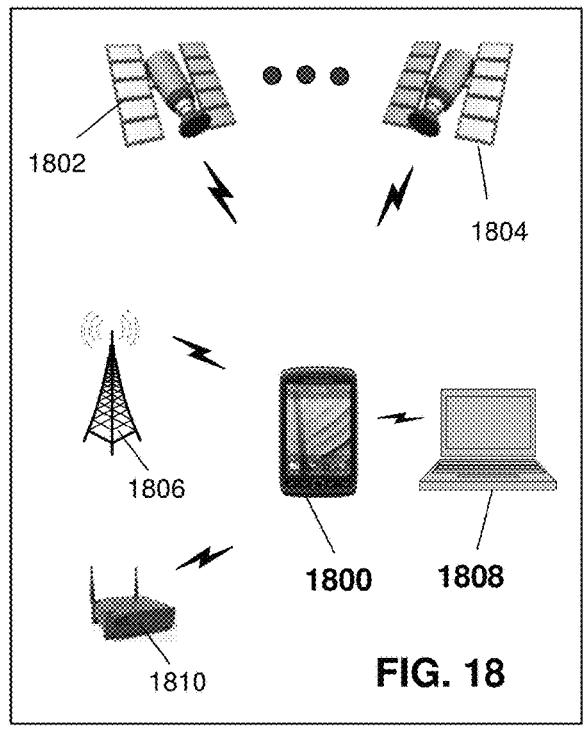

For a phone 1600 with a slideable keypad 1604 (illustrated in FIG. 16), the keypad in an outward position can present one range of load impedances of an internal antenna, while the keypad in a hidden position can present another range of load impedances, each of which can be analyzed empirically. For a smartphone 1700 (illustrated in FIG. 17) presenting a video game, an assumption can be made that the user is likely to hold the phone away from the user's ear in order to view the game. Placing the smartphone 1700 in a portrait position 1702 can represent one physical and operational use case, while utilizing the smartphone 1700 in a landscape position 1704 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1700 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 1800 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1800. For example, a multimode phone 1800 that provides GPS services by processing signals received from a constellation of satellites 1802, 1804 can be empirically analyzed when other access technologies are also in use. Suppose, for instance, that while navigation services are enabled, the multimode phone 1800 is facilitating voice communications by exchanging wireless messages with a cellular base station 1806. In this state, an internal antenna of the GPS receiver may be affected by a use case of a user holding the multimode phone 1800 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1800 (e.g., slider out), which can result in a probable hand position of the user of the multimode phone 1800. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1808 or with a wireless access point 1810. In diversity designs such as multiple-input and multiple output (MIMO) antennas, physical and functional use cases of a communication device can be measured empirically to determine how best to configure a tunable compensation circuit 822 such as shown in FIG. 8.

The number of physical and functional use cases of a communication device 800 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling (e.g., via decoupling data utilized for generating a pre-distortion signal to be combined with the RF signals prior to transmission), counter the effect of varying load impedances, and to improve other performance metrics of the transceiver 802 can also be determined empirically. The empirical data collected and corresponding mitigation strategies can be recorded in the look-up table of FIG. 14 and indexed according to combinations of physical and functional use cases detected by the communication device 100. The information stored in the look-up table can be used in open-loop RF tuning applications to initialize tunable circuit components of the transceiver 802, as well as, tuning algorithms that control operational aspects of the tunable circuit components.

Upon reviewing the aforementioned embodiments, it would be evident to an artisan with ordinary skill in the art that said embodiments can be modified, reduced, or enhanced without departing from the scope of the claims described below. For example, the pre-distortion signal can be other than the inverse of the coupling matrix. For instance, the inverse of the coupling matrix can be determined and then can be further adjusted based on other factors to generate the pre-distortion signal. In this example, a compromise between mitigating mutual coupling and satisfying one more other performance goals can be sought resulting in generating the pre-distortion signal according to something other than the inverse of the coupling matrix.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 19:
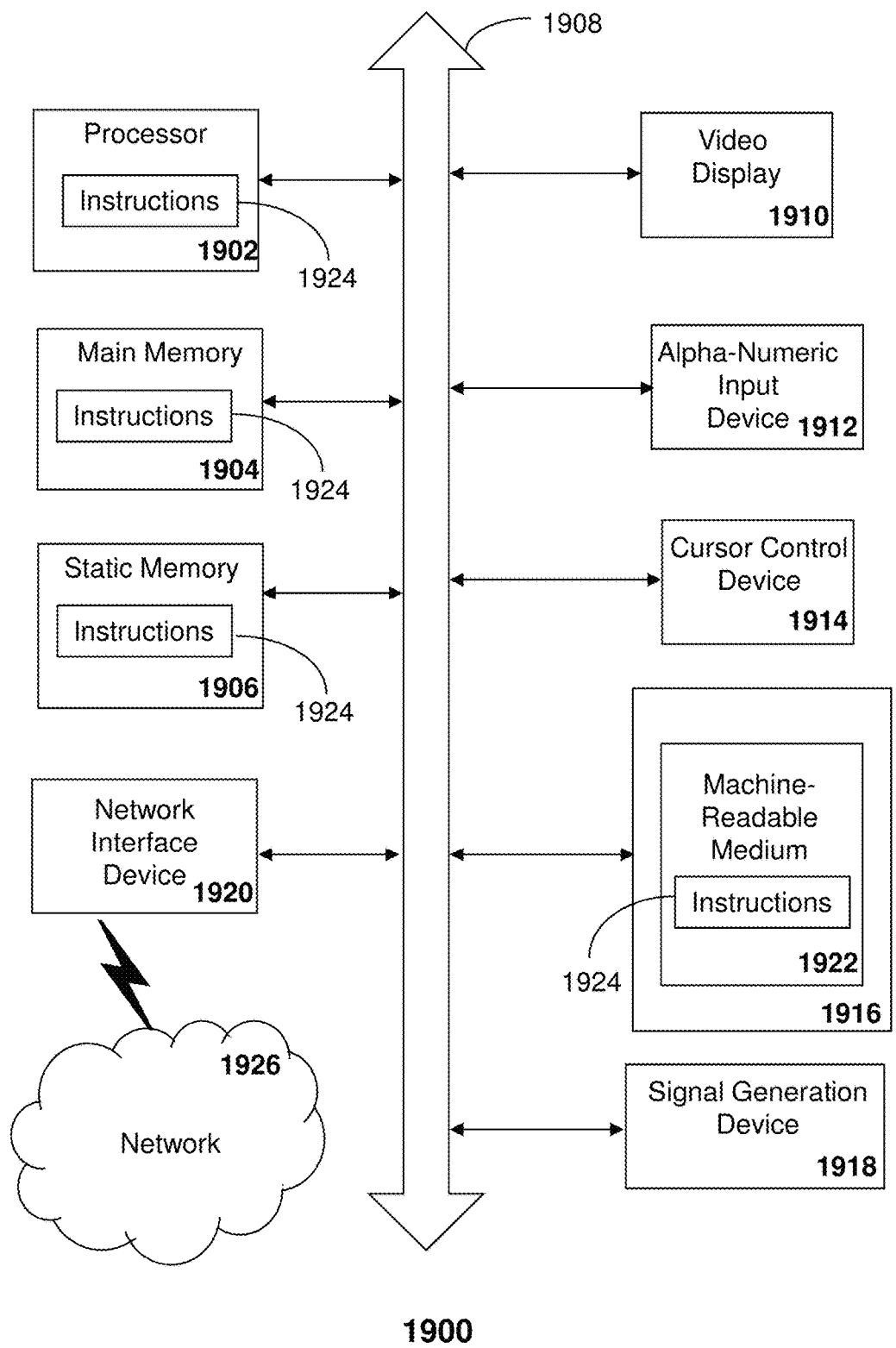
FIG. 19 depicts an illustrative diagrammatic representation of a machine in the form of a computer system within which a set of instructions, when executed, may cause the machine to perform any one or more of the methodologies disclosed herein.

FIG. 19 depicts an exemplary diagrammatic representation of a machine in the form of a computer system 1900 within which a set of instructions, when executed, may cause the machine to perform any one or more of the methods discussed above. One or more instances of the machine can operate, for example, as the communication device 100, the processor 106, the communication device 800 or the controller 806. The computer system 1900 can provide mutual coupling compensation via a pre-distortion signal, such as described with respect to methods 600 and/or 700.

In some embodiments, the machine may be connected (e.g., using a network 1926) to other machines. In a networked deployment, the machine may operate in the capacity of a server or a client user machine in server-client user network environment, or as a peer machine in a peer-to-peer (or distributed) network environment. The machine may comprise a server computer, a client user computer, personal computer (PC), a tablet PC, a smart phone, a laptop computer, a desktop computer, a control system, a network router, switch or bridge, or any machine capable of executing a set of instructions (sequential or otherwise) that specify to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1900 may include a processor (or controller) 1902 (e.g., a central processing unit (CPU), a graphics processing unit (GPU, or both), a main memory 1904 and a static memory 1906, which communicate with each other via a bus 1908. The computer system 1900 may further include a display unit 1910 (e.g., a liquid crystal display (LCD), a flat panel, or a solid state display. The computer system 1900 may include an input device 1912 (e.g., a keyboard), a cursor control device 1914 (e.g., a mouse), a disk drive unit 1916, a signal generation device 1918 (e.g., a speaker or remote control) and a network interface device 1920. In distributed environments, the embodiments described in the subject disclosure can be adapted to utilize multiple display units 1910 controlled by two or more computer systems 1900. In this configuration, presentations described by the subject disclosure may in part be shown in a first of the display units 1910, while the remaining portion is presented in a second of the display units 1910.

The disk drive unit 1916 may include a tangible computer-readable storage medium 1922 on which is stored one or more sets of instructions (e.g., software 1924) embodying any one or more of the methods or functions described herein, including those methods illustrated above. The instructions 1924 may also reside, completely or at least partially, within the main memory 1904, the static memory 1906, and/or within the processor 1902 during execution thereof by the computer system 1900. The main memory 1904 and the processor 1902 also may constitute tangible computer-readable storage media.

Dedicated hardware implementations including, but not limited to, application specific integrated circuits, programmable logic arrays and other hardware devices can likewise be constructed to implement the methods described herein.

Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 1922 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium where the stored signals are non-transitory.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1900.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A wireless communication device, comprising:
multiple ports connecting to an antenna;
a memory storing machine-readable instructions; and
an RF front end comprising a processing system including a processor coupled to the memory and the multiple ports, wherein the processing system, responsive to executing the machine-readable instructions, facilitates performance of operations comprising:
determining a use case for communications;
selecting coupling coefficients comprising a high-frequency coupling coefficient and a low-frequency coupling coefficient according to the use case based on de-coupling data stored in the memory;
generating a pre-distortion signal, wherein the pre-distortion signal comprises a high-frequency signal based on the high-frequency coupling coefficient and a low-frequency signal based on the low-frequency coupling coefficient, wherein the high-frequency coupling coefficient differs from the low-frequency coupling coefficient;
applying the pre-distortion signal to RF signals to obtain pre-distorted RF signals;
applying the pre-distorted RF signals at feeds of the multiple ports; and
transmitting the pre-distorted RF signals via the multiple ports.

2. The wireless communication device of claim 1, wherein the multiple ports are part of a multiple-input and multiple-output antenna system, and wherein the wireless communication device is a mobile device.

3. The wireless communication device of claim 1, wherein the multiple ports are part of a multi-mode antenna system, and wherein the wireless communication device is a mobile device.

4. The wireless communication device of claim 1, wherein the multiple ports are part of an antenna system, and wherein the wireless communication device is not a mobile device.

5. The wireless communication device of claim 1, wherein the operations further comprise:
determining a first mean square error of the pre-distorted RF signals; and determining a second mean square error of the RF signals, wherein the first mean square error of the pre-distorted RF signals is less than the second mean square error of the RF signals.

6. The wireless communication device of claim 1, wherein the generating of the pre-distortion signal according to the coupling coefficients comprises:
   generating a coupling matrix using the high-frequency coupling coefficient and the low-frequency coupling coefficient;
   inverting the coupling matrix to determine a de-coupling matrix; and
   generating the pre-distortion signal based on the de-coupling matrix.

7. The wireless communication device of claim 1, further comprising a baseband processor, wherein the antenna comprises a single, two-port antenna, wherein the multiple ports are associated with the single, two-port antenna, and wherein the use case includes a physical use state of the wireless communication device.

8. The wireless communication device of claim 1, wherein the applying of the pre-distortion signal at the feeds comprises applying the pre-distortion signal at the feeds of a subset of ports of the multiple ports, wherein at least one port of the multiple ports does not receive the pre-distortion signal.

9. The wireless communication device of claim 1, wherein the operations further comprise:
   determining a change from the use case to a second use case;
   selecting second coupling coefficients according to the second use case based on the de-coupling data stored in the memory;
   generating a second pre-distortion signal according to the second coupling coefficients;
   applying the second pre-distortion signal at the feeds of the multiple ports to additional RF signals to generate second pre-distorted RF signals; and
   transmitting the second pre-distorted RF signals via the multiple ports.

10. The wireless communication device of claim 1, wherein the determining of the use case comprises measuring a reflected power associated with the multiple ports, and wherein the applying of the pre-distortion signal to the RF signals is a linear combination.

11. The wireless communication device of claim 1, wherein the operations further comprise provisioning the memory with the de-coupling data, wherein the de-coupling data is pre-determined by a computing device based on different antenna spacing.

12. The wireless communication device of claim 1, further comprising a matching network including a variable reactance element, wherein the variable reactance element is adjusted according to the use case to provide impedance tuning.

13. A wireless communication device, comprising:
   multiple ports connecting to a single antenna or to different antennas;
   a memory storing machine-readable instructions; and
   an RF front end comprising a processing system including a processor coupled to the memory and the multiple ports, wherein the processor, responsive to executing the machine-readable instructions, facilitates performance of operations comprising:
      forming an estimate of multi-port antenna coupling coefficients comprising high-frequency coupling coefficients and low-frequency coupling coefficients that differ from the high-frequency coupling coefficients;
      generating a pre-distortion signal by linearly combining RF signals based on computations using the multi-port antenna coupling coefficients, wherein the RF signals comprise high-frequency signals and low-frequency signals, wherein the linearly combining of the high-frequency signals are based on the high-frequency coupling coefficients and wherein the linearly combining of the low-frequency signals are based on the low-frequency coupling coefficients;
      applying the pre-distortion signal at feeds of the multiple ports; and
      transmitting pre-distorted RF signals via the multiple ports based on the applying of the pre-distortion signal.

14. The wireless communication device of claim 13, further comprising a matching network including a variable reactance element, wherein the variable reactance element is adjusted according to a determined use case to provide impedance tuning.

15. A machine-readable storage medium encoded with machine-executable instructions that when executed by a processing system including a processor of an RF front end coupled to a memory and to multiple ports connecting to a single antenna or to different antennas, facilitates performance of operations comprising:
   determining a use case for communications;
   identifying coupling coefficients according to the use case based on de-coupling data stored in the memory, wherein the coupling coefficients comprise high-frequency coupling coefficients and different low-frequency coupling coefficients;
   generating a pre-distortion signal according to the coupling coefficients, wherein the pre-distortion signal comprises a high-frequency signal based on the high-frequency coupling coefficients and a low-frequency signal based on the low-frequency coupling coefficients;
   applying the pre-distortion signal to RF signals to obtain pre-distorted RF signals;
   applying the pre-distorted RF signals at feeds of the multiple ports; and
   transmitting the pre-distorted RF signals via the multiple ports.

16. The machine-readable storage medium of claim 15, wherein the determining of the use case comprises measuring a reflected power associated with the multiple ports, and wherein the applying of the pre-distortion signal to the RF signals is a linear combination.

17. The machine-readable storage medium of claim 15, wherein the operations further comprise:
   determining a change from the use case to a second use case;
   selecting second coupling coefficients according to the second use case based on the de-coupling data stored in the memory;
   generating a second pre-distortion signal according to the second coupling coefficients;
   applying the second pre-distortion signal at the feeds of the multiple ports to additional RF signals to generate second pre-distorted RF signals; and
   transmitting the second pre-distorted RF signals via the multiple ports.

18. A method comprising:

identifying, by an RF front end, comprising a processing system including a processor coupled to a memory, a use case for communications;

determining, by the RF front end, coupling coefficients comprising a high-frequency coupling coefficient and a low-frequency coupling coefficient according to the use case based on de-coupling data stored in the memory;

generating, by the RF front end, a pre-distortion signal, wherein the pre-distortion signal comprises a high-frequency signal based on the high-frequency coupling coefficient and a low-frequency signal based on the low-frequency coupling coefficient, wherein the high-frequency coupling coefficient differs from the low-frequency coupling coefficient;

applying, by the RF front end, the pre-distortion signal to RF signals to obtain pre-distorted RF signals;

applying the pre-distorted RF signals at feeds of multiple ports connecting to a single antenna or to different antennas; and transmitting the pre-distorted RF signals via the multiple ports.

19. The method of claim 18, wherein the identifying of the use case comprises measuring a reflected power associated with the multiple ports, and wherein the applying of the pre-distortion signal to the RF signals is a linear combination.

20. The method of claim 18, further comprising:

determining, by the RF front end, a change from the use case to a second use case;

selecting second coupling coefficients according to the second use case based on the de-coupling data stored in the memory;

generating, by the RF front end, a second pre-distortion signal according to the second coupling coefficients;

applying, by the RF front end, the second pre-distortion signal at the feeds of the multiple ports to additional RF signals to generate second pre-distorted RF signals; and transmitting the second pre-distorted RF signals via the multiple ports.

* * * * *